United States Patent
Rivers et al.

(10) Patent No.: US 11,394,190 B2
(45) Date of Patent: Jul. 19, 2022

(54) MULTI-FREQUENCY GROUND FAULT CIRCUIT INTERRUPTER APPARATUSES, SYSTEMS, AND METHOD

(71) Applicant: ABB Schweiz AG, Baden (CH)

(72) Inventors: Cecil Rivers, West Hartford, CT (US); David Joseph Lituchy, West Hartford, CT (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/085,301

(22) Filed: Oct. 30, 2020

(65) Prior Publication Data

US 2022/0140592 A1    May 5, 2022

(51) Int. Cl.
| | |
|---|---|
| *H02H 3/00* | (2006.01) |
| *H02H 1/00* | (2006.01) |
| *G01R 31/52* | (2020.01) |
| *G01R 15/18* | (2006.01) |
| *H02H 3/33* | (2006.01) |

(52) U.S. Cl.
CPC ......... *H02H 1/0007* (2013.01); *G01R 15/183* (2013.01); *G01R 31/52* (2020.01); *H02H 3/334* (2013.01)

(58) Field of Classification Search
None
See application file for complete search history.

(56) References Cited

U.S. PATENT DOCUMENTS

| | | | | |
|---|---|---|---|---|
| 5,089,752 | A * | 2/1992 | Pacholok | H05B 41/2851 |
| | | | | 315/224 |
| 6,437,955 | B1 * | 8/2002 | Duffy | H02H 3/025 |
| | | | | 361/113 |
| 6,532,139 | B2 | 3/2003 | Kim et al. | |
| 7,368,918 | B2 * | 5/2008 | Henson | H02H 1/0015 |
| | | | | 324/536 |
| 7,885,045 | B1 | 2/2011 | Morgan et al. | |
| 2003/0156367 | A1 | 8/2003 | Macbeth | |
| 2005/0083616 | A1 | 4/2005 | Reid et al. | |
| 2005/0286184 | A1 | 12/2005 | Campolo | |
| 2007/0208520 | A1 * | 9/2007 | Zhang | H02H 3/335 |
| | | | | 702/58 |
| 2008/0140354 | A1 | 6/2008 | Kolker et al. | |
| 2009/0160425 | A1 | 6/2009 | Berland et al. | |
| 2009/0198459 | A1 | 8/2009 | Bilac et al. | |
| 2010/0309592 | A1 | 12/2010 | Kinsel | |
| 2010/0324747 | A1 | 12/2010 | Lee et al. | |
| 2011/0080177 | A1 | 4/2011 | Beck et al. | |
| 2011/0216453 | A1 | 9/2011 | Haines et al. | |
| 2012/0119918 | A1 | 5/2012 | Williams | |

(Continued)

*Primary Examiner* — Stephen W Jackson
(74) *Attorney, Agent, or Firm* — Greenberg Traurig, LLP

(57) ABSTRACT

A GFCI includes a current sensor system providing a current sensor signal indicating a leakage current of the AC power system. A magnitude detector is configured to provide a first channel signal indicating an RMS value of the current sensor signal. A reference signal generator is configured to provide a second channel signal indicating a trip reference value responsive to a frequency of the current sensor signal. A fault detector is configured to provide a fault trip signal indicating ground fault condition of the AC power system in response to the first channel signal and the second channel signal. A circuit breaker mechanism is configured to open a circuit of the AC power system in response to the fault trip signal.

20 Claims, 5 Drawing Sheets

(56) References Cited

U.S. PATENT DOCUMENTS

| | | |
|---|---|---|
| 2015/0109077 A1 | 4/2015 | Tomimbang et al. |
| 2015/0168487 A1* | 6/2015 | Parker .................. H02H 1/0007 |
| | | 702/58 |
| 2017/0149235 A1 | 5/2017 | Cui et al. |
| 2019/0356127 A1 | 11/2019 | Ostrovsky et al. |
| 2019/0377021 A1* | 12/2019 | Bhalwankar ......... G01R 15/202 |

* cited by examiner

MULTI-FREQUENCY GROUND FAULT CIRCUIT INTERRUPTER APPARATUSES, SYSTEMS, AND METHOD

TECHNICAL FIELD

The present disclosure relates generally to ground fault circuit interrupters and more particularly but not exclusively to multi-frequency or wide-band ground fault circuit interrupter apparatuses, systems, and methods.

BACKGROUND

Ground fault circuit interrupters ("GFCI") are useful in a number of applications including electrical outlets and receptacles, in-line electrical with appliances or their power cords, and circuit breaker boxes, cabinets, or other enclosures, among other applications. Existing GFCI suffer from a number of drawbacks, limitations, and shortcomings. For example, many focus on ground fault currents around 60 Hz or other frequencies associated with electrical utility power supplies (e.g., 50 Hz) and fail to accurately detect and interrupt ground faults at higher frequencies or over a broader frequency range. Additionally, many existing GFCI suffer from undesirable complexity, power consumption, failure modes, and other shortcomings. There remains a significant unmet need for the unique apparatuses, methods, systems, and techniques disclosed herein.

DISCLOSURE OF EXAMPLE EMBODIMENTS

For the purposes of clearly, concisely, and exactly describing example embodiments of the present disclosure, the manner, and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created, and that the invention includes and protects such alterations, modifications, and further applications of the example embodiments as would occur to one skilled in the art.

SUMMARY OF THE DISCLOSURE

Some example embodiments comprise unique GFCI configured to detect a ground fault condition of an AC power system in response to magnitude and frequency of a fault current and to open a circuit of the AC power system in response to the ground fault condition. Further embodiments, forms, objects, features, advantages, aspects, and benefits shall become apparent from the following description and drawings.

DETAILED DESCRIPTION OF EXAMPLE EMBODIMENTS

Figure 1:
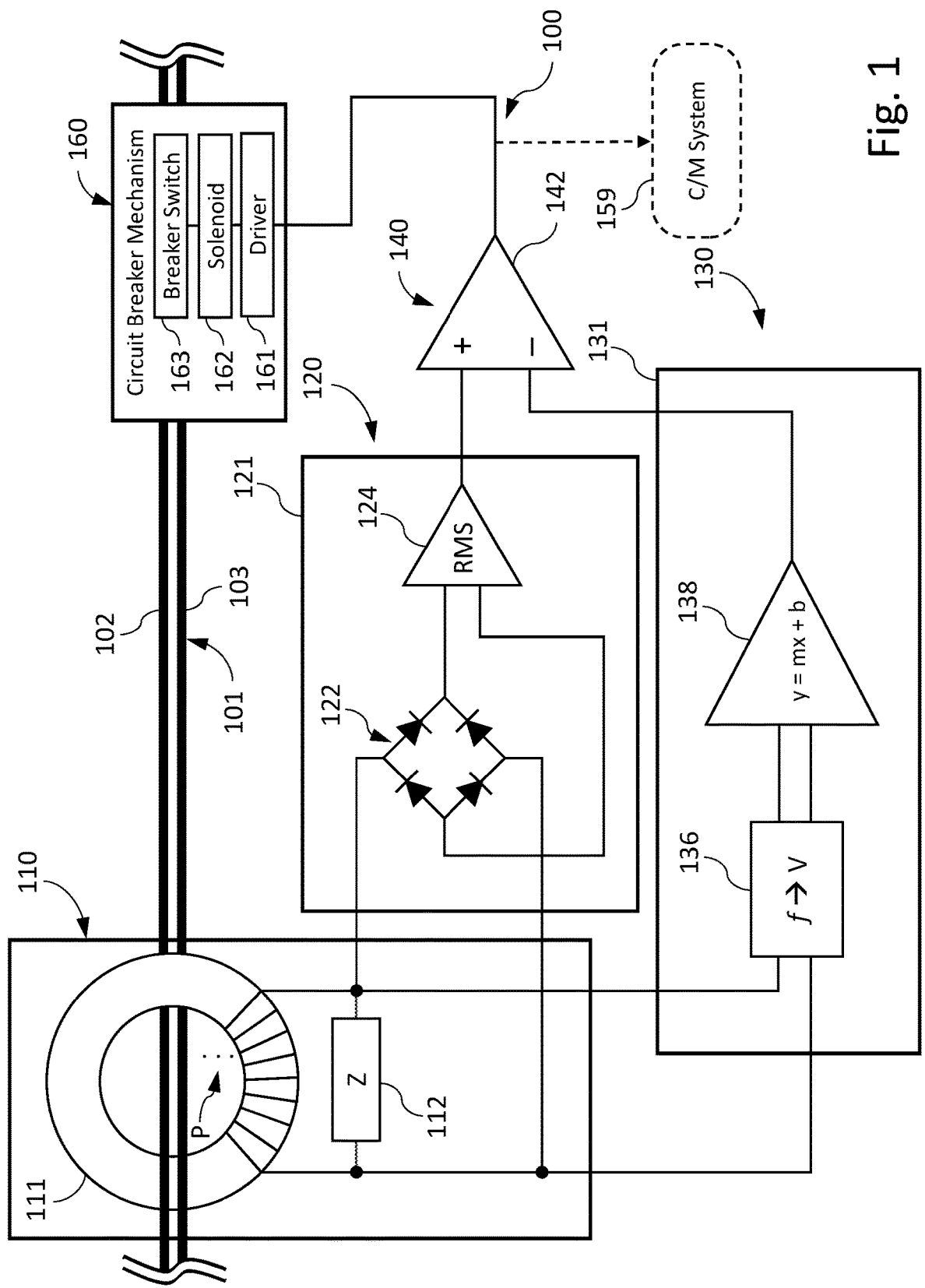
FIG. 1 is a circuit diagram illustrating certain aspects of an example GFCI.

With reference to FIG. 1, there is illustrated an example ground fault circuit interrupter 100 (also referred to herein as GFCI 100). GFCI 100 includes a current sensor system 110 which is operatively coupled with and structured to sense current through an alternating current electrical power system 101 (also referred to herein as AC power system 101). In the illustrated example, the AC power system 101 includes a phase conductor 102 and a neutral conductor 103. As indicated by ellipsis P, in some embodiments, the AC power system 101 may be provided with one or more additional conductors. In some embodiments, the AC power system 101 may be configured as a split-phase system including two phase conductors and a neutral conductor. In some embodiments, the AC power system 101 may be configured as a three-phase system including three phase conductors and a neutral conductor. More generally, in some embodiment, the AC power system 101 may be configured as an n-phase system including n phase conductors and at least one neutral conductor. In some embodiment, the AC power system 101 may be configured to include other numbers and arrangements of one or more phase conductors and at least one neutral conductor.

In the illustrated example, the current sensor system 110 includes a current transformer 111 which is operatively coupled with the phase conductor 102 and the neutral conductor 103 on a primary side (also referred to as a primary winding or primary conductor) and operatively coupled with one or more impedance components 112 (e.g., a resistor, a capacitor, a resistor in combination with a capacitor, or other arrangements including resistive and/or capacitive elements) on a secondary side (also referred to as a secondary winding or a secondary conductor). The current transformer 111 is one example of a current sensor which may be utilized in the current sensor system 110 to provide a current sensor signal indicating a leakage current of the power system 101. Other embodiments may additionally or alternatively include and utilize other types of current sensors including, for example, current transformers dedicated to individual conductors, multiple current transformers dedicated to respective sets of one or more conductors, shunt resistors or other current sensing resistor arrangements, Hall-effect current sensors, fluxgate current sensors, quadrature current transformers, Rogowski coils, Faraday-effect current sensors, or other types of current sensors.

In the illustrated example, the current transformer 111 is a differential current transformer configured to provide a secondary side current with a magnitude proportional to the sum of the magnitudes of the primary side currents through at least two conductors (e.g., phase conductor 102 and neutral conductor 103). Due to the opposing polarity of the primary side currents, the magnitude of the secondary side current indicates a difference between the magnitudes of the primary side current which, in turn, indicates a leakage current of the AC power system 101. A portion of the difference may be attributable to impedance or other losses of the AC power system 101. Another portion of the difference may indicate a ground fault condition of the AC power system. Accordingly, a leakage current exceeding a certain magnitude may indicate a ground fault condition. This relationship may be utilized to establish a trip curve an example of which is described below in connection with FIG. 4. In some embodiments, individual current sensors may be utilized for individual conductors of the AC power system 101 and their respective current sensor outputs may be utilized to indicate a difference between currents of the at least two conductors of the AC power system 101 and, in turn, to indicate a leakage current of the AC power system 101.

GFCI 100 includes a first channel 120 which is operatively coupled with the current sensor system 110. The first channel 120 includes a magnitude detector 121 configured to provide a first channel signal indicating a magnitude of the current sensor signal provided by the current sensor system 110 (e.g., an RMS amplitude or another value including an indication of a magnitude of the current sensor signal). In the illustrated example, the magnitude detector 121 includes a rectifier 122 configured to rectify the current sensor signal and an amplifier 124 operatively coupled with the rectifier 122 and configured to output an RMS value of the rectified current sensor signal as the first channel signal. For example, in some embodiments, the amplifier 124 may be configured and tuned to provide an RMS amplitude value equal to or approximating $$\frac{V_{peak}}{\sqrt{2}}$$

where $V_{peak}$ is the peak value of the voltage output of the rectifier 122. In some embodiments, the RMS amplitude may be determined in accordance with other RMS calculations as will occur to one of skill in the art with the benefit of the present disclosure. It shall be appreciated that the magnitude detector 121 may be configured to detect a scalar or absolute value of the current sensor signal or may be configured to detect an amplitude or vector value including magnitude and direction or polarity of the current sensor signal. In some embodiments, the magnitude detector 121 may be configured to detect other values including, for example, other magnitudes or amplitudes of the current sensor signal, such as other average values, instantaneous values, peak values, or other values as will occur to one of skill in the art with the benefit of the present disclosure.

GFCI 100 includes a second channel 130 which is operatively coupled with the current sensor system 110. The second channel 130 includes a reference signal generator 131 configured to provide a second channel signal indicating a trip reference value responsive to a frequency of the current sensor signal. In the illustrated example, the reference signal generator 131 includes a frequency-to-voltage converter 136 configured to output a voltage value which varies in response to a frequency of the current sensor signal, and an amplifier 138 operatively coupled with the frequency-to-voltage converter and configured to output the second channel signal in response to the voltage value.

Figure 2:
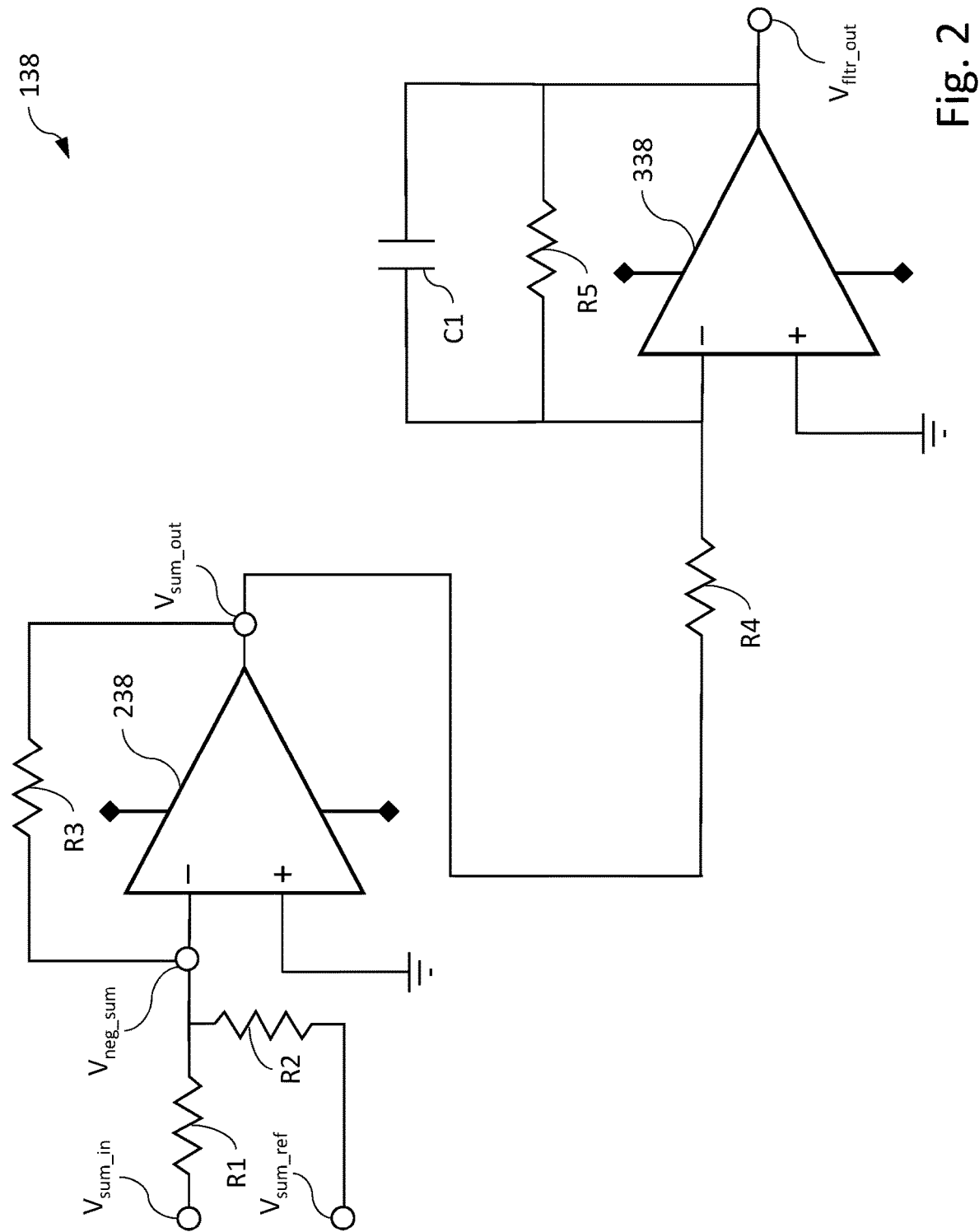
FIG. 2 is a circuit diagram illustrating further details of a portion of the GFCI of FIG. 1.

In the illustrated example, the amplifier 138 is configured to provide linear or approximately linear amplification in accordance with a linear equation y=mx+b, wherein y is the output of the amplifier 138, m is the gain of the amplifier 138, x is the input of the amplifier 138, and b is an offset of the amplifier 138. In some embodiments, the amplifier may be configured in accordance with a non-linear equation such as an exponential, polynomial, piecewise-linear, or as another type of nonlinear amplifier as will occur to one of skill in the art with the benefit of the present disclosure The amplifier 138 may be provided in a number of forms including, for example, one or more operational amplifiers. As illustrated in FIG. 2, one example embodiment of the amplifier 138 comprises a first operational amplifier 238 configured as a summing amplifier coupled in series with a second operational amplifier 338 configured as an inverting and filtering amplifier. The first operation amplifier 238 includes two voltage inputs ($V_{sum\_in}$ and $V_{sum\_ref}$) and their respective resistors R1 and R2. The noninverting input of the first operational amplifier 238 is coupled with ground. During operation, the inverting input of the amplifier is pulled to virtual ground by the output of the amplifier. The two input voltage signals are converted to current signals by their respective resistors. This current flows from the voltage inputs, through their respective resistors, through R3 and generates a voltage at $V_{sum\_out}$ which is the sum of the two input current multiplied by R3. The voltage seen at $V_{sum\_out}$ is proportional to the sum of the input voltages, and is equal to $-1*(R3/R1*V_{sum\_in}+R3/R2*V_{sum\_ref})$. A negative feedback proportional to a summer output voltage ($V_{sum\_out}$) of the amplifier 238 is provided to its negative input by a voltage drop of the summer output voltage ($V_{sum\_out}$) across resistor R3.

The second operational amplifier 338 is configured so that its negative input is provided with a voltage proportional to the output voltage ($V_{sum\_out}$) of the first operational amplifier 238 by a voltage drop of the output voltage ($V_{sum\_out}$) across resistor R4. The positive input of the second operational amplifier 338 is coupled with ground. A negative feedback proportional to the output voltage ($V_{ftr\_out}$) of the second operational amplifier 338 is provided to the negative input of the second operational amplifier 338 by an RC filter comprising resistor R5 coupled in parallel with capacitor C1.

Figure 4:
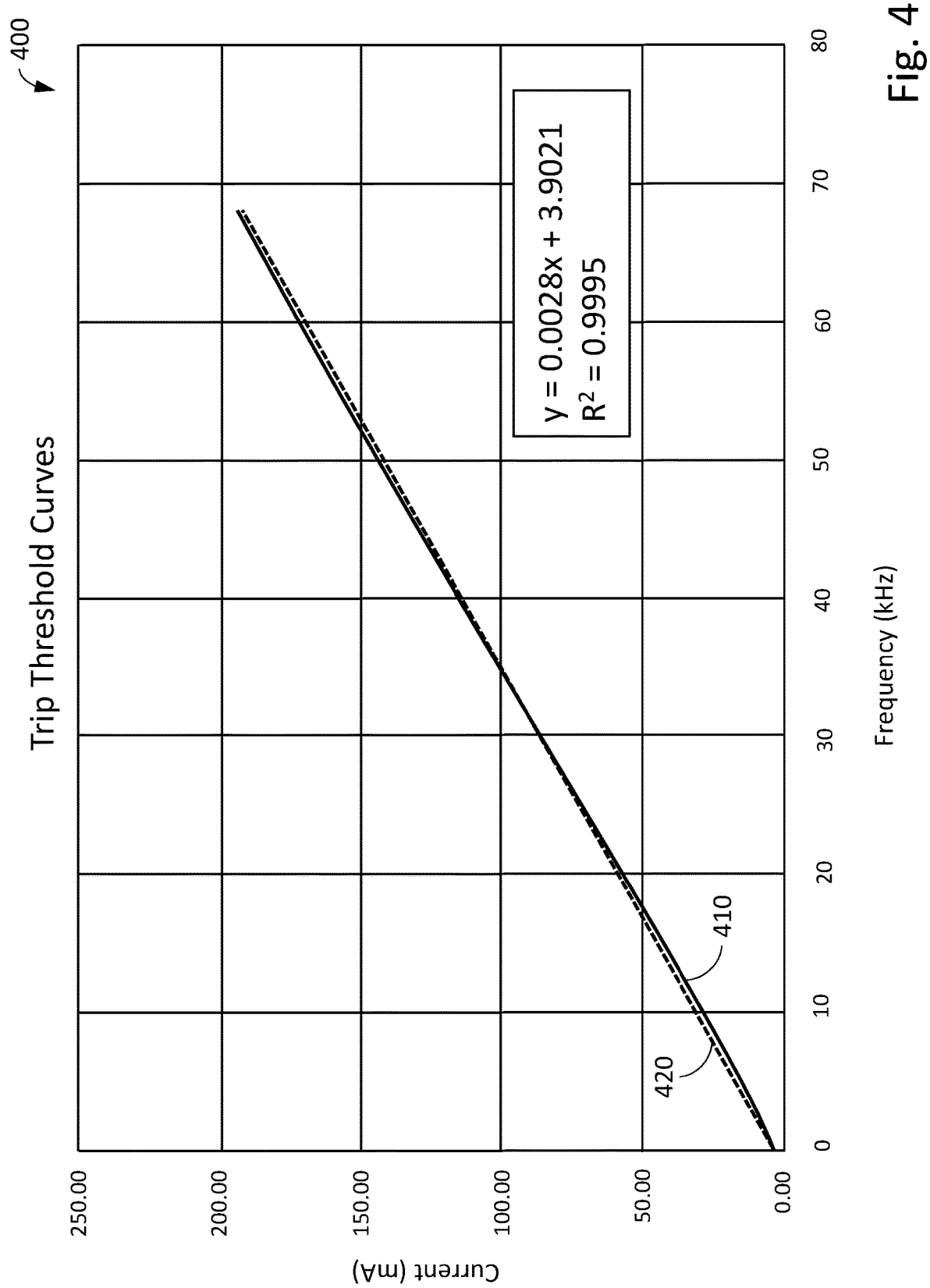
FIG. 4 is a graph illustrating an example trip curve.

The reference signal generator 131 may be configured to implement a frequency responsive trip curve defining a circuit breaker trip threshold that varies in response to variation in the frequency of the current sensor signal. FIG. 4 illustrates a graph 400 providing an example of such an implementation. The graph 400 depicts a defined trip curve 419 which may be established by a regulatory, certification or standard-setting authority, by requirements of a particular application, customer or implementation, or various combinations thereof. In the illustrated example, the defined trip curve 410 follows a linear equation (y=0.0028x+3.9021). In other embodiments, the defined trip curve 410 may follow a linear equation with a different slope and/or offset, or may follow a non-linear equation such as an exponential, polynomial, piecewise-linear, or as another type of nonlinear equation.

The graph 400 also depicts an implemented trip curve 420 which may be implemented or established by the reference signal generator 131 or another reference signal generator. In the illustrated example, the implemented trip curve 420 conforms with and follows the defined trip curve 410 with a R-squared confidence interval 0.9995 although implemented trip curves with lesser or greater confidence intervals may also be utilized.

A fault detector 140 is operatively coupled with the first channel 120 and the second channel 130 and configured to provide a fault trip signal indicating ground fault condition of the AC power system in response to the first channel signal and the second channel signal. In the illustrated example, the fault detector 140 comprises a voltage comparator 142 including a first input (+) configured to receive the first channel signal and a second input (−) configured to receive the second channel signal and to output a fault trip signal when a value of the first channel signal exceeds a value of the second channel signal, for example, if the first channel signal is greater than the second channel signal or if the first channel signal is greater than or equal to the second channel signal.

A circuit breaker mechanism 160 is operatively coupled with the fault detector 140 and is configured to open a circuit of the AC power system in response to the fault trip signal. In the illustrated example, the circuit breaker mechanism 160 includes a driver 161 configured to drive a solenoid 162 to open a breaker switch 163 in response to the fault trip signal. In other embodiments, a number of other circuit breaker mechanisms configured to trip or open in response to an electrical signal may be utilized as will occur to those of skill in the art with the benefit of the present disclosure. In some embodiments, the fault trip signal may also be provided to a control and/or monitoring (C/M) system, 159 which may log or record instances of the fault trip signal and may utilize the fault trip signal in providing alerts or warnings or initiating automated control operations.

It shall be appreciated that the signals described herein comprise characteristics of a non-transitory medium such as circuitry or components which when configured or operated with the described signals may be considered a non-transitory memory medium configured to store input, output, provide, or receive information of the signals. For example, the analog circuitry, components, and devices of GFCI 100 described above or GFCI 100' described below may be considered non-transitory analog memory media configured to store a signal for at least some duration or under at least some operating conditions. It shall be further appreciated that, in the illustrated example the current sensor signal, the first channel signal, the second channel signal, and the fault trip signal comprise voltage signals and that the corresponding circuitry and devices that provide these signals as outputs, receive these signals as inputs, and/or convert or otherwise act upon these signals are configured and provided in forms suitable for operation with voltage signals. In other embodiments, these signals may comprise current signals and the corresponding circuitry and devices may be configured and provided in forms suitable for operation with current signals. It shall be further appreciated GFCI 100 may be implemented using analog circuitry and components or without using digital circuitry or components although some embodiments may utilize analog circuitry and components in connection with some digital circuitry or components.

Figure 3:
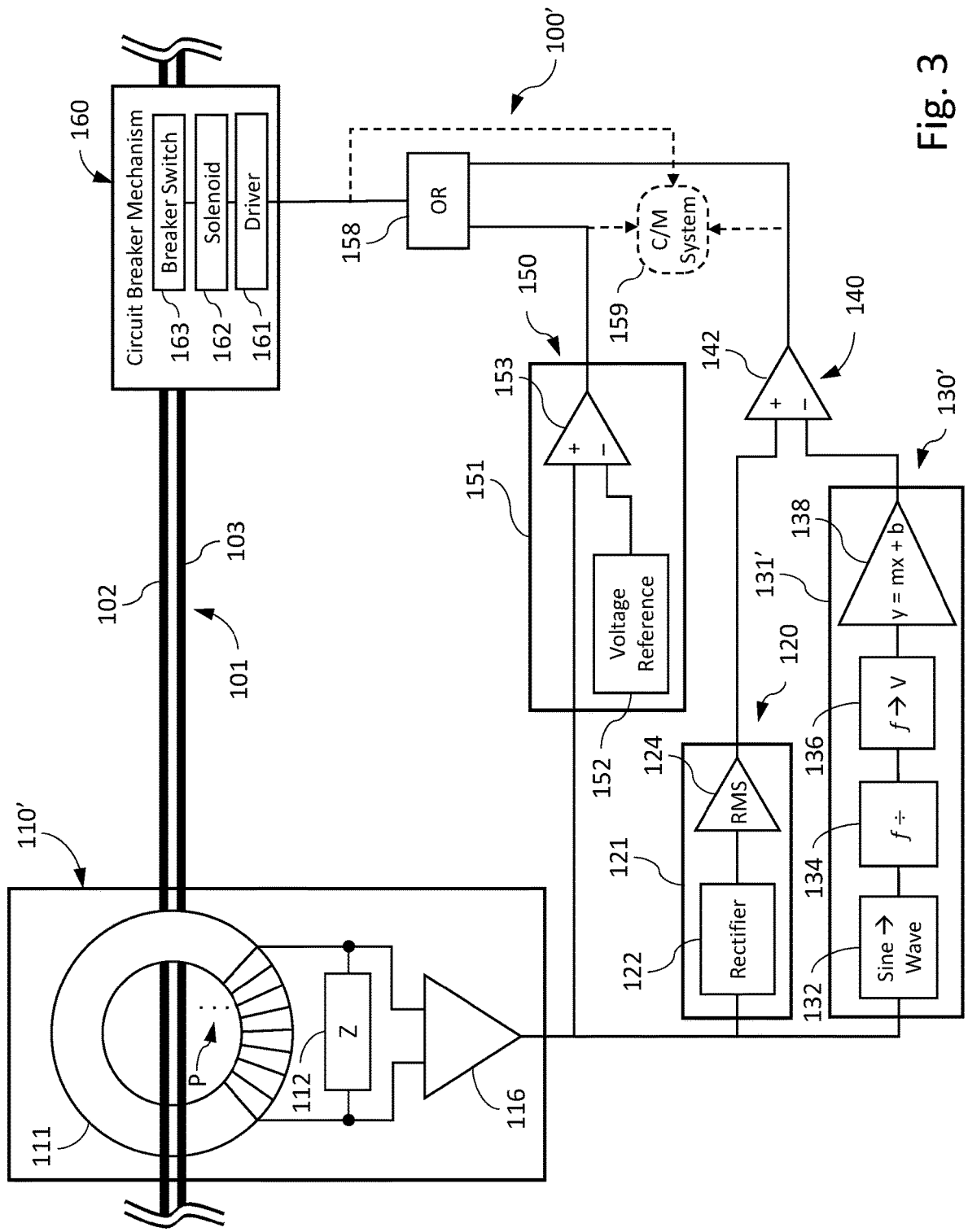
FIG. 3 is a circuit diagram illustrating certain aspects of an example GFCI.

With reference to FIG. 3, there is illustrated an example ground fault circuit interrupter 100' (also referred to herein as GFCI 100'). GFCI 100' includes a number of features that are the same as or substantially similar to those described above in connection with GFCI 100. Such features are labeled with the same reference numerals as those utilized in FIG. 1 and the description thereof. It shall be appreciated that such features include the same or substantially similar characteristics, components, devices, elements, functionalities, operations, and other attributes as those described in connection with GFCI 100 and FIG. 1, including the illustrated examples and the described additions, alternatives, and variations thereof.

GFCI 100' also includes a number of additional or alternative features relative to those described above in connection with GFCI 100. It shall be appreciated that such features may include some or all of the same or substantially similar characteristics, components, devices, elements, functionalities, operations, and other attributes as those described in connection with GFCI 100 and FIG. 1, including the illustrated examples and the described additions, alternatives, and variations thereof, and may additionally or alternatively comprise features varying from or adding to those of GFCI 100 including the following examples.

The current sensor system 110' of GFCI 100' includes an amplifier 116 operatively coupled with the one or more impedance components 112 and current transformer 111. The amplifier 116 is configured to amplify the voltage across the one or more impedance components 112 to provide the current sensor signal in an amplified form. The amplifier 116 may be provided in a number of forms. In some example embodiments, the amplifier 116 may comprise one or more operational amplifiers. In some example embodiments, the amplifier 116 may comprise a two-stage amplifier. In some example embodiments, the amplifier 116 may comprise a first operational amplifier configured as a buffer which is coupled with a second operational amplifier configured as a first amplification stage (e.g., an inverting amplifier). In some example embodiments, the amplifier 116 may comprise a first operational amplifier configured as a buffer which is coupled with a second operational amplifier configured as a first amplification stage (e.g., as a first inverting amplifier) which, in turn, coupled with a third operational amplifier configured as a second amplification stage (e.g., as a second inverting amplifier).

The reference signal generator 131' includes a frequency divider 134 configured to reduce the frequency of the current sensor signal and to provide the reduced frequency current sensor signal to the frequency-to-voltage converter 136. The reference signal generator 131' further includes a sine-to-square wave converter 132 configured to convert a sinusoidal shape of the current signal to a square shape (also referred to as a pulse shape and not necessarily strictly geometrically square or rectilinear) and to provide the square-shaped current sensor signal to a frequency divider 134 and, in turn, to the frequency-to-voltage converter 136. It shall be appreciated that some embodiments may include only one of the sine-to-square wave converter 132 and the frequency divider 134 or may omit both of the sine-to-square wave converter 132 and the frequency divider 134.

GFCI 100' includes a third channel 150 operatively coupled with the current sensor system 110' and including a second fault detector 151 configured to provide a second fault trip signal to the circuit breaker mechanism 160 in response to the current sensor signal. The second fault detector 151 is operatively coupled with the current sensor system 110' and is configured to provide a second fault trip signal indicating a second ground fault condition of the AC power system in response to the current sensor signal exceeding a second threshold. In the illustrated example, the second fault detector 151 comprises a voltage comparator 153 including a first input (+) configured to receive the current sensor signal and a second input (−) configured to receive a second voltage reference 152, and to output a fault trip signal when a value of the current sensor signal exceeds a value of the second voltage reference 152, for example, if the first channel signal is greater than the second channel signal or if the first channel signal is greater than or equal to the second channel signal. The second fault detector 151 may be configured as a fast trip fault detector and, in response to the current sensor signal exceeding a second trip reference value, may provide the second fault trip signal a time before the time required for the first trip signal to be provided by the fault detector 140. The second trip reference value may establish a threshold or magnitude greater than the trip reference value of the second channel, for example, a maximum permissible current magnitude for the AC power system 101.

The GFCI 100' includes an OR logic operator 158 which may be an OR gate or another gate or logic component arrangement configured to implement OR logic. The OR logic operator 158 includes a first input coupled with and configured to receive the output of the fault detector 140 which is responsive to the first channel signal and the second channel signal. The OR logic operator 158 includes a second input coupled with and configured to receive the output of second fault detector 151 which is responsive to a third channel signal of the third channel. The output of the OR logic operator 158 is coupled with the circuit breaker mechanism 160 which may be tripped to open a circuit of the AC power system 101 if either of the two inputs to the OR logic operator 158 is true.

As illustrated in FIG. 3, the trip signal provided by the fault detector 140 and the second trip signal provided by the second fault detector 151 may be individually provided to the C/M system 159 to facilitate differentiation of different types of trip events. The trip signal output by the OR logic operator 158 may be additionally provided to the C/M system 159 in combination with the trip signal provided by the fault detector 140 and the second trip signal provided by the second fault detector 151 to facilitate confirmation of a fault trip event. Alternatively, The trip signal output by the OR logic operator 158 alone may be provided to the C/M system 159 without the trip signal provided by the fault detector 140 and the second trip signal provided by the second fault detector 151.

Figure 5:
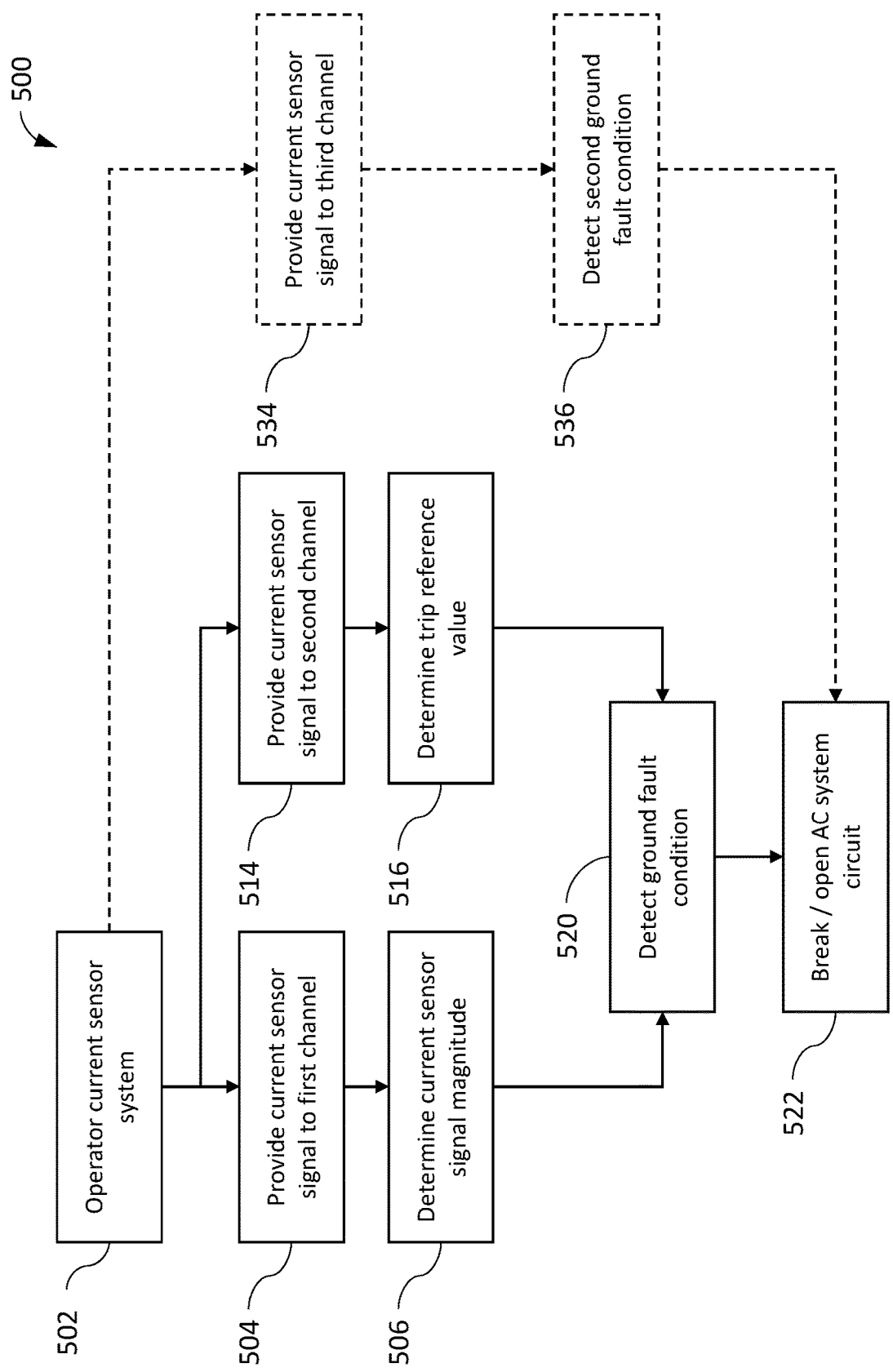
FIG. 5 is a flow diagram illustrating certain aspects of an example method of operating a GFCI.

With reference to FIG. 5, there is illustrated an example process 500 which may be implemented or performed by a GFCI such as GFCI 100 or GFCI 100' and which provides one example of a method of operating a GFCI such as GFCI 100 or GFCI 100'. Process 500 begins at operation 502 which operates a current sensor system to provide a current sensor signal indicating a leakage current of an AC power system. In some embodiments, operation 502 may include operating a current transformer operatively coupled with at least a phase conductor and a neutral conductor of an AC power system on a primary side and operatively coupled with an impedance component on a secondary side to provide a voltage across the impedance component. In some embodiments, operation 502 may additionally include amplifying the voltage across the impedance component to provide the current sensor signal. In some embodiments, the current sensor signal may comprise a current signal. In some embodiments, the current sensor signal may be otherwise adjusted, conditioned, converted, filtered, or otherwise operated upon by the sensor system to provide the current sensor signal in a desired form. Operation 502 may be performed, for example, by the current sensor system 110 of GFCI 100, the current sensor system 110' of GFCI 100', or another current sensor system.

From operation 502, process 500 proceeds to operations 504 and 514 which may be performed at least partially concurrently or at least partially in parallel. Operation 504 provides the current sensor signal to a first channel including a magnitude detector. Operation 504 may be performed, for example, in connection with the first channel 120 of GFCI 100 or GFCI 100' or a first channel of another GFCI. From operation 504, process 500 proceeds to operation 506 which operates a magnitude detector of the first channel to provide a first channel signal indicating a magnitude of the current sensor signal. In some embodiments, operation 506 may include rectifying the current sensor signal, determining an RMS value of the rectified current sensor signal, and providing the RMS value as the first channel signal. Operation 506 may be performed, for example, by the magnitude detector 121 of GFCI 100 or GFCI 100' or another magnitude detector.

Operation 514 includes providing the current sensor signal to a second channel including a reference signal generator. Operation 514 may be performed, for example, in connection with the second channel 130 of GFCI 100, the second channel 130' of GFCI 100', or a second channel of another GFCI. From operation 514, process 500 proceeds to operation 516 which operates the reference signal generator to provide a second channel signal indicating a trip reference value responsive to a frequency of the current sensor signal. In some embodiments, operation 516 may include converting a frequency of the current sensor signal to a voltage and determining the second channel signal in response to the voltage. In some embodiments, the act of determining the second channel signal in response to the voltage may include providing the voltage to an amplifier and operating the amplifier to provide the second channel signal indicating a trip reference value. In some embodiments, operation 516 may additionally or alternatively include one or both of converting the current sensor signal from a sinusoidal shape to a square shape, and reducing a frequency of the current sensor signal. Operation 516 may be performed, for example, by the reference signal generator 131 of GFCI 100, the reference signal generator 131' of the GFCI 100', or another reference signal generator.

From operations 506 and 516, process 500 proceeds to operation 520 which detects a ground fault condition of the AC power system in response to the first channel signal and the second channel signal. In some embodiments, operation 520 may include comparing the first channel signal and a second channel signal, and indicating the ground fault condition if the first channel signal exceeds a value of the second channel signal, for example, if the first channel signal is greater than the second channel signal or if the first channel signal is greater than or equal to the second channel signal. Operation 520 may be performed, for example, by the fault detector 140 of GFCI 100 or GFCI 100', or another fault detector.

From operation 520, process 500 proceeds to operation 522 which opens a circuit of the AC power system in response to the detecting the ground fault condition. In some embodiments, operation 522 may be performed by the circuit breaker mechanism 160 of GFCI 100 or GFCI 100', or another circuit breaker mechanism. In some embodiments, operation 522 may include operating a driver (e.g., driver 161) to actuate a solenoid (e.g., solenoid 162) to open a breaker switch (e.g., breaker switch 163) in response to a fault determination.

In some embodiments, process 500 may additionally include operations 534 and 536. Operations 534 includes providing the current sensor signal to a third channel and may be performed in connection with the third channel 150 of GFCI 100' or another third channel of another GFCI. From operation 534, process 500 proceeds to operation 536 which detects a second ground fault condition of the AC power system in response to the current sensor signal. In some embodiments, operation 536 detects the second ground fault condition at a time prior to or before a time required for the detecting the ground fault condition of the AC power system in response to the first channel signal and the second channel signal. Operation 536 may be performed in connection with the second fault detector 151 of GFCI 100' or another second fault detector. From operation 536, process 500 proceeds to operation 522.

It shall be appreciated that in process 500 may utilize a variety of signal types in performing the foregoing operations. For example, one or more of the current sensor signal, the first channel signal, the second channel signal, and the third channel signal may comprise voltage signals or may comprise current signals. It shall be further appreciated that some embodiments may perform process 500 using only analog circuitry and components such as those of GFCI 100 or GFCI 100' or without using digital circuitry or components whereas some embodiments may perform process 500 using analog circuitry and components such as those of GFCI 100 or GFCI 100' in connection with one or more digital circuitry or components.

A number of example embodiments shall now be further described. A first example embodiment is an apparatus comprising: a current sensor system operatively coupled with an AC power system and configured to provide a current sensor signal indicating a leakage current of the AC power system; a first channel operatively coupled with the current sensor system and including a magnitude detector configured to provide a first channel signal indicating a magnitude of the current sensor signal; a second channel operatively coupled with the current sensor system and including a reference signal generator configured to provide a second channel signal indicating a trip reference value varying in response to a frequency of the current sensor signal; a fault detector operatively coupled with the first channel and the second channel and configured to provide a fault trip signal indicating ground fault condition of the AC power system in response to the first channel signal and the second channel signal; and a circuit breaker mechanism operatively coupled with the fault detector and configured to open a circuit of the AC power system in response to the fault trip signal.

A second example embodiment is an apparatus including the features of the first example embodiment wherein the current sensor system comprises a current transformer operatively coupled with at least a phase conductor and a neutral conductor of the AC power system on a primary side and operatively coupled with an impedance component on a secondary side wherein the current sensor signal comprises a voltage across the impedance component.

A third example embodiment is an apparatus including the features of the second example embodiment wherein the current sensor system includes an amplifier operatively coupled with the impedance component and configured to amplify the voltage across the impedance component to provide the current sensor signal.

A fourth example embodiment is an apparatus including the features of any of the first through third example embodiments wherein the magnitude detector includes a rectifier configured to rectify the current sensor signal and an amplifier operatively coupled with the rectifier and configured to output an RMS value of the rectified current sensor signal as the first channel signal.

A fifth example embodiment is an apparatus including the features of any of the first through fourth example embodiments wherein the reference signal generator includes a frequency-to-voltage converter configured to output a voltage value responsive to a frequency of the current sensor signal, and an amplifier operatively coupled with the frequency-to-voltage converter and configured to output the second channel signal in response to the voltage value. A sixth example embodiment is an apparatus including the features of the fifth example embodiment wherein the reference signal generator includes a frequency divider configured to reduce the frequency of the current sensor signal and to provide the reduced frequency current sensor signal to the frequency-to-voltage converter.

A seventh example embodiment is an apparatus including the features of the fifth example embodiment wherein the reference signal generator includes a sine-to-square wave converter configured to convert a sinusoidal shape of the current signal to a square shape and to provide the square-shaped current sensor signal to the frequency-to-voltage converter.

An eighth example embodiment is an apparatus including the features of any of the first through seventh example embodiments wherein the fault detector comprises a voltage comparator including a first input configured to receive the first channel signal and a second input configured to receive the second channel signal.

A ninth example embodiment is an apparatus including the features of any of the first through eighth example embodiments wherein the circuit breaker mechanism includes a driver configured to drive a solenoid operatively coupled with a breaker switch in response to the fault trip signal.

A tenth example embodiment is an apparatus including the features of any of the first through ninth example embodiments wherein the current sensor signal, the first channel signal, and the second channel signal comprise voltage signals.

A eleventh example embodiment is an apparatus including the features of any of the first through tenth example embodiments comprising a third channel operatively coupled with the current sensor system and including a second fault detector configured to provide a second fault trip signal to the circuit breaker mechanism in response to the current sensor signal.

A twelfth example embodiment is an apparatus including the features of any of the first through eleventh example embodiments wherein the second fault detector is configured to provide the second fault trip signal a time before the first trip signal would be provided by the fault detector in response to the current sensor signal exceeding a second trip reference value greater than the trip reference value of the second channel.

A thirteenth example embodiment is a method comprising: operating a current sensor system to provide a current sensor signal indicating a leakage current of an AC power system; providing the current sensor signal to a first channel including a magnitude detector; operating the magnitude detector to provide a first channel signal indicating a magnitude of the current sensor signal; providing the current sensor signal to a second channel including a reference signal generator; operating the reference signal generator to provide a second channel signal indicating a trip reference value responsive to a frequency of the current sensor signal; detecting a ground fault condition of the AC power system in response to the first channel signal and the second channel signal; and opening a circuit of the AC power system in response to the detecting the ground fault condition.

A fourteenth example embodiment is a method including the features of the thirteenth example embodiment wherein the operating the current sensor system comprises operating a current transformer operatively coupled with at least a phase conductor and a neutral conductor of the AC power system on a primary side and operatively coupled with an impedance component on a secondary side to provide a voltage across the impedance component.

A fifteenth example embodiment is a method including the features of the thirteenth example embodiment or the fourteenth example embodiment wherein the operating the current sensor system comprises amplifying a voltage across the impedance component to provide the current sensor signal.

A sixteenth example embodiment is a method including the features of any of the thirteenth through fifteenth example embodiments wherein the operating the magnitude detector comprises determining an RMS value of the rectified current sensor signal, and providing the RMS value as the first channel signal.

A seventeenth example embodiment is a method including the features of any of the thirteenth through sixteenth example embodiments wherein the operating the reference signal generator includes converting a frequency of the current sensor signal to a voltage and determining the second channel signal in response to the voltage.

An eighteenth example embodiment is a method including the features of any of the thirteenth through seventeenth example embodiments wherein the operating the reference signal generator includes one or both of (a) converting the current sensor signal from a sinusoidal shape to a square shape, and (b) reducing the frequency of the current sensor signal.

A nineteenth example embodiment is a method including the features of any of the thirteenth through eighteenth example embodiments wherein the detecting a ground fault condition includes comparing the first channel signal and a second channel signal, and indicating the ground fault condition if the first channel signal exceeds a value of the second channel signal.

A twentieth example embodiment is a method including the features of any of the thirteenth through nineteenth example embodiments wherein the detecting a ground fault condition includes comparing the first channel signal and a second channel signal, and indicating the ground fault condition if the first channel signal exceeds a value of the second channel signal wherein the current sensor signal, the first channel signal, and the second channel signal comprise voltage signals.

A twenty-first example embodiment is a method including the features of any of the thirteenth through twentieth example embodiments comprising providing the current sensor signal to a third channel and detecting a second ground fault condition of the AC power system in response to the current sensor signal, and opening the circuit of the AC power system in response to the detecting the second ground fault condition.

A twenty-second example embodiment is a method including the features of the twenty-first example embodiment wherein the detecting a second ground fault condition occurs before a time required for the detecting the ground fault condition of the AC power system in response to the first channel signal and the second channel signal.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. An apparatus, comprising:
a current sensor system operatively coupled with an AC power system and configured to provide a current sensor signal indicating a leakage current of the AC power system;
a first channel operatively coupled with the current sensor system and including a magnitude detector configured to provide a first channel signal indicating a magnitude of the current sensor signal;
a second channel operatively coupled with the current sensor system and including a reference signal generator configured to provide a second channel signal indicating a trip reference value varying in response to a frequency of the current sensor signal;
wherein the reference signal generator includes:
a frequency-to-voltage converter configured to output a voltage value responsive to a frequency of the current sensor signal, and
an amplifier operatively coupled with the frequency-to-voltage converter and configured to output the second channel signal in response to the voltage value;
a fault detector operatively coupled with the first channel and the second channel and configured to provide a fault trip signal indicating ground fault condition of the AC power system in response to the first channel signal and the second channel signal; and
a circuit breaker mechanism operatively coupled with the fault detector and configured to open a circuit of the AC power system in response to the fault trip signal.

2. The apparatus of claim 1, wherein the current sensor system comprises a current transformer operatively coupled with at least a phase conductor and a neutral conductor of the AC power system on a primary side and operatively coupled with an impedance component on a secondary side wherein the current sensor signal comprises a voltage across the impedance component.

3. The apparatus of claim 2, wherein the current sensor system includes an amplifier operatively coupled with the impedance component and configured to amplify the voltage across the impedance component to provide the current sensor signal.

4. The apparatus of claim 1, wherein the magnitude detector includes a rectifier configured to rectify the current sensor signal and an amplifier operatively coupled with the rectifier and configured to output an RMS value of the rectified current sensor signal as the first channel signal.

5. The apparatus of claim 1, wherein the reference signal generator includes a frequency divider configured to reduce the frequency of the current sensor signal and to provide the reduced frequency current sensor signal to the frequency-to-voltage converter.

6. The apparatus of claim 1, wherein the reference signal generator includes a sine-to-square wave converter configured to convert a sinusoidal shape of the current signal to a square shape and to provide the square-shaped current sensor signal to the frequency-to-voltage converter.

7. The apparatus of claim 1, wherein the fault detector comprises a voltage comparator including a first input configured to receive the first channel signal and a second input configured to receive the second channel signal.

8. The apparatus of claim 1, wherein the circuit breaker mechanism includes a driver configured to drive a solenoid operatively coupled with a breaker switch in response to the fault trip signal.

9. The apparatus of claim 1, wherein the current sensor signal, the first channel signal, and the second channel signal comprise voltage signals.

10. The apparatus of claim 1, comprising a third channel operatively coupled with the current sensor system and including a second fault detector configured to provide a second fault trip signal to the circuit breaker mechanism in response to the current sensor signal.

11. The apparatus of claim 10, wherein the second fault detector is configured to provide the second fault trip signal a time before the first trip signal would be provided by the fault detector in response to the current sensor signal exceeding a second trip reference value greater than the trip reference value of the second channel.

12. A method, comprising:
operating a current sensor system to provide a current sensor signal indicating a leakage current of an AC power system;
providing the current sensor signal to a first channel including a magnitude detector; operating the magnitude detector to provide a first channel signal indicating a magnitude of the current sensor signal;
providing the current sensor signal to a second channel including a reference signal generator;
operating the reference signal generator to provide a second channel signal indicating a trip reference value responsive to a frequency of the current sensor signal;
wherein the operating the reference signal generator includes converting a frequency of the current sensor signal to a voltage and determining the second channel signal in response to the voltage;
detecting a ground fault condition of the AC power system in response to the first channel signal and the second channel signal; and
opening a circuit of the AC power system in response to the detecting the ground fault condition.

13. The method of claim 12, wherein the operating the current sensor system comprises operating a current transformer operatively coupled with at least a phase conductor and a neutral conductor of the AC power system on a primary side and operatively coupled with an impedance component on a secondary side to provide a voltage across the impedance component.

14. The method of claim 12, wherein the operating the current sensor system comprises amplifying a voltage across the impedance component to provide the current sensor signal.

15. The method of claim 12, wherein the operating the magnitude detector comprises determining an RMS value of the rectified current sensor signal, and providing the RMS value as the first channel signal.

16. The method of claim 12, wherein the operating the reference signal generator includes one or both of (a) converting the current sensor signal from a sinusoidal shape to a square shape, and (b) reducing the frequency of the current sensor signal.

17. The method of claim 12, wherein the detecting a ground fault condition includes comparing the first channel signal and a second channel signal, and indicating the ground fault condition if the first channel signal exceeds a value of the second channel signal.

18. The method of claim 12, wherein the current sensor signal, the first channel signal, and the second channel signal comprise voltage signals.

19. The method of claim 12, comprising providing the current sensor signal to a third channel and detecting a second ground fault condition of the AC power system in response to the current sensor signal, and opening the circuit of the AC power system in response to the detecting the second ground fault condition.

20. The method of claim 19, wherein the detecting a second ground fault condition occurs before a time required for the detecting the ground fault condition of the AC power system in response to the first channel signal and the second channel signal.

* * * * *